United States Patent
Lu

(10) Patent No.: US 10,216,574 B2
(45) Date of Patent: Feb. 26, 2019

(54) ADAPTIVE ERROR CORRECTION CODES FOR DATA STORAGE SYSTEMS

(71) Applicant: Western Digital Technologies, Inc., Irvine, CA (US)

(72) Inventor: Guangming Lu, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 111 days.

(21) Appl. No.: 14/570,820

(22) Filed: Dec. 15, 2014

(65) Prior Publication Data

US 2015/0100854 A1    Apr. 9, 2015

Related U.S. Application Data

(63) Continuation of application No. 13/659,099, filed on Oct. 24, 2012, now Pat. No. 8,972,826.

(51) Int. Cl.
*H03M 13/00*    (2006.01)
*G06F 11/10*    (2006.01)
(Continued)

(52) U.S. Cl.
CPC ...... *G06F 11/1072* (2013.01); *G06F 11/1048* (2013.01); *H03M 13/1102* (2013.01);
(Continued)

(58) Field of Classification Search
CPC ... H04L 1/0009; H04L 1/0057; H04L 1/0041; H04L 1/0071; H03M 13/35;
(Continued)

(56) References Cited

U.S. PATENT DOCUMENTS

| 5,621,660 A | 4/1997 | Chaddha et al. |
| 5,768,535 A | 6/1998 | Chaddha et al. |

(Continued)

FOREIGN PATENT DOCUMENTS

| CN | 101950586 A | 1/2011 |
| CN | 102005250 A | 4/2011 |

(Continued)

OTHER PUBLICATIONS

Notice of Allowance dated Oct. 24, 2014 from U.S. Appl. No. 13/659,099, 11 pages.

(Continued)

*Primary Examiner* — Albert Decady
*Assistant Examiner* — Enam Ahmed
(74) *Attorney, Agent, or Firm* — Morgan, Lewis & Bockius LLP

(57) ABSTRACT

A data storage system configured to adaptively code data is disclosed. In one embodiment, a data storage system controller determines a common memory page size, such as an E-page size, for a non-volatile memory array. Based on the common memory page size, the controller selects a low-density parity-check (LDPC) code word length from a plurality of pre-defined LDPC code word lengths. The controller determines LDPC coding parameters for coding data written to or read from the memory array based on the selected LDPC code word length. By using the plurality of pre-defined LDPC code word lengths, the data storage system can support multiple non-volatile memory page formats, including memory page formats in which the common memory page size does not equal any LDPC code word length of the plurality of pre-defined LDPC code word lengths. Flexibility and efficiency of data coding can thereby be achieved.

8 Claims, 6 Drawing Sheets

300

| Column Weight | P Matrix Size (bits) | Code Length = 2048 + 128·Δ (bytes) | | |
|---|---|---|---|---|
| | | Δ = 1 | Δ = 2 | |
| 4 | 256 | (C1) 68 | 72 | Row Weight |
| | | 2176 | 2304 | Code Length (bytes) |
| | | 2048 | 2176 | User Data (bytes) |
| | | 0.941 | 0.944 | Code Rate |
| | 512 | (C3) 34 | 36 | Row Weight |
| | | 2176 | 2304 | Code Length (bytes) |
| | | 1920 | 2048 | User Data (bytes) |
| | | 0.882 | 0.889 | Code Rate |
| 5 | 256 | (C2) 68 | 72 | Row Weight |
| | | 2176 | 2304 | Code Length (bytes) |
| | | 2016 | 2144 | User Data (bytes) |
| | | 0.926 | 0.931 | Code Rate |
| | 512 | (C4) 34 | 36 | Row Weight |
| | | 2176 | 2304 | Code Length (bytes) |
| | | 1856 | 1984 | User Data (bytes) |
| | | 0.853 | 0.861 | Code Rate |

(51) Int. Cl.
*H03M 13/11* (2006.01)
*H03M 13/35* (2006.01)

(52) U.S. Cl.
CPC ......... *H03M 13/35* (2013.01); *H03M 13/353* (2013.01); *H03M 13/618* (2013.01); *H03M 13/6356* (2013.01); *H03M 13/6516* (2013.01)

(58) Field of Classification Search
CPC ........... H03M 13/6516; H03M 13/618; H03M 13/353; H03M 13/1102; H03M 13/6356; G06F 11/1072; G06F 11/1048
USPC ........................................................ 714/774
See application file for complete search history.

(56) References Cited

U.S. PATENT DOCUMENTS

| | | | |
|---|---|---|---|
| 6,011,868 A | 1/2000 | van den Branden et al. | |
| 6,289,471 B1 | 9/2001 | Gordon | |
| 6,418,549 B1* | 7/2002 | Ramchandran | H03M 13/03 714/748 |
| 6,856,556 B1 | 2/2005 | Hajeck | |
| 6,895,547 B2 | 5/2005 | Eleftheriou et al. | |
| 6,934,904 B2 | 8/2005 | Talagala et al. | |
| 7,072,417 B1 | 7/2006 | Burd et al. | |
| 7,126,857 B2 | 10/2006 | Hajeck | |
| 7,129,862 B1 | 10/2006 | Shirdhonkar et al. | |
| 7,149,846 B2 | 12/2006 | Hetrick | |
| 7,263,651 B2 | 8/2007 | Xia et al. | |
| 7,346,832 B2 | 3/2008 | Richardson et al. | |
| 7,395,490 B2 | 7/2008 | Richardson et al. | |
| 7,409,492 B2 | 8/2008 | Tanaka et al. | |
| 7,430,136 B2 | 9/2008 | Merry, Jr. et al. | |
| 7,447,807 B1 | 11/2008 | Merry et al. | |
| 7,500,172 B2 | 3/2009 | Shen et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,657,816 B2 | 2/2010 | Cohen et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,739,576 B2 | 6/2010 | Radke | |
| 7,765,373 B1 | 7/2010 | Merry et al. | |
| 7,797,611 B2 | 9/2010 | Dholakia et al. | |
| 7,809,994 B2 | 10/2010 | Gorobets | |
| 7,814,393 B2 | 10/2010 | Kyung et al. | |
| 7,898,855 B2 | 3/2011 | Merry, Jr. et al. | |
| 7,912,991 B1 | 3/2011 | Merry et al. | |
| 7,913,149 B2 | 3/2011 | Gribok et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,161,345 B2 | 4/2012 | Graef | |
| 8,166,245 B2 | 4/2012 | Diggs et al. | |
| 8,176,284 B2 | 5/2012 | Frost et al. | |
| 8,176,360 B2 | 5/2012 | Frost et al. | |
| 8,179,292 B2 | 5/2012 | Nakagawa | |
| 8,181,089 B1 | 5/2012 | Fernandes et al. | |
| 8,239,735 B2* | 8/2012 | Shalvi | G11C 16/349 714/774 |
| 8,243,525 B1 | 8/2012 | Kan | |
| 8,254,172 B1 | 8/2012 | Kan | |
| 8,261,012 B2 | 9/2012 | Kan | |
| 8,276,028 B2* | 9/2012 | Man | G11C 11/5642 365/185.01 |
| 8,296,625 B2 | 10/2012 | Diggs et al. | |
| 8,312,207 B2 | 11/2012 | Merry, Jr. et al. | |
| 8,312,341 B1* | 11/2012 | Varnica | H04L 1/0001 714/746 |
| 8,316,176 B1 | 11/2012 | Phan et al. | |
| 8,339,919 B1 | 12/2012 | Lee | |
| 8,341,339 B1 | 12/2012 | Boyle et al. | |
| 8,341,501 B2* | 12/2012 | Franceschini | G06F 12/0246 711/103 |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 8,898,548 B1* | 11/2014 | Mullendore | H03M 13/353 365/185.09 |
| 8,996,957 B1* | 3/2015 | Northcott | G06F 11/1012 714/763 |
| 9,432,298 B1* | 8/2016 | Smith | H04L 49/9057 |
| 2003/0037298 A1 | 2/2003 | Eleftheriou et al. | |
| 2004/0098659 A1 | 5/2004 | Bjerke et al. | |
| 2005/0160218 A1 | 7/2005 | See et al. | |
| 2005/0204253 A1 | 9/2005 | Sukhobok et al. | |
| 2005/0216821 A1 | 9/2005 | Harada | |
| 2005/0246617 A1 | 11/2005 | Kyung et al. | |
| 2006/0036925 A1 | 2/2006 | Kyung et al. | |
| 2006/0036933 A1 | 2/2006 | Blankenship et al. | |
| 2006/0085593 A1 | 4/2006 | Lubbers et al. | |
| 2007/0124648 A1 | 5/2007 | Dholakia et al. | |
| 2007/0226598 A1 | 9/2007 | Chiu et al. | |
| 2008/0141054 A1 | 6/2008 | Danilak | |
| 2008/0155160 A1 | 6/2008 | McDaniel et al. | |
| 2008/0168304 A1 | 7/2008 | Flynn et al. | |
| 2008/0195900 A1 | 8/2008 | Chang et al. | |
| 2008/0244353 A1 | 10/2008 | Dholakia et al. | |
| 2008/0282128 A1 | 11/2008 | Lee et al. | |
| 2008/0301521 A1 | 12/2008 | Gunnam et al. | |
| 2008/0316819 A1 | 12/2008 | Lee | |
| 2009/0070652 A1 | 3/2009 | Myung et al. | |

(56) References Cited

U.S. PATENT DOCUMENTS

| | | |
|---|---|---|
| 2009/0193184 A1 | 7/2009 | Yu et al. |
| 2009/0240873 A1 | 9/2009 | Yu et al. |
| 2009/0241008 A1 | 9/2009 | Kim et al. |
| 2009/0241009 A1 | 9/2009 | Kong et al. |
| 2009/0249159 A1 | 10/2009 | Lee et al. |
| 2009/0259805 A1 | 10/2009 | Kilzer et al. |
| 2010/0017650 A1 | 1/2010 | Chin et al. |
| 2010/0020611 A1 | 1/2010 | Park |
| 2010/0049914 A1 | 2/2010 | Goodwin |
| 2010/0083071 A1 | 4/2010 | Shen et al. |
| 2010/0100788 A1 | 4/2010 | Yang et al. |
| 2010/0107030 A1 | 4/2010 | Graef |
| 2010/0125695 A1 | 5/2010 | Wu et al. |
| 2010/0131819 A1 | 5/2010 | Graef |
| 2010/0174849 A1 | 7/2010 | Walston et al. |
| 2010/0250793 A1 | 9/2010 | Syu |
| 2010/0251068 A1 | 9/2010 | Lin et al. |
| 2010/0268985 A1 | 10/2010 | Larsen et al. |
| 2010/0275088 A1 | 10/2010 | Graef |
| 2010/0315874 A1 | 12/2010 | Ghodsi |
| 2011/0066793 A1 | 3/2011 | Burd |
| 2011/0099323 A1 | 4/2011 | Syu |
| 2011/0126078 A1 | 5/2011 | Ueng et al. |
| 2011/0179333 A1 | 7/2011 | Wesel et al. |
| 2011/0191649 A1 | 8/2011 | Lim et al. |
| 2011/0213919 A1 | 9/2011 | Frost et al. |
| 2011/0214037 A1 | 9/2011 | Okamura et al. |
| 2011/0231737 A1 | 9/2011 | Dachiku |
| 2011/0231739 A1 | 9/2011 | Kim |
| 2011/0239088 A1 | 9/2011 | Post |
| 2011/0246852 A1* | 10/2011 | Sabbag ............... G06F 11/1048 714/755 |
| 2011/0246862 A1 | 10/2011 | Graef |
| 2011/0252294 A1 | 10/2011 | Ng et al. |
| 2011/0283049 A1 | 11/2011 | Kang et al. |
| 2011/0283164 A1 | 11/2011 | Tang et al. |
| 2011/0296273 A1 | 12/2011 | Rub |
| 2011/0302477 A1 | 12/2011 | Goss et al. |
| 2012/0072654 A1 | 3/2012 | Olbrich et al. |
| 2012/0079189 A1 | 3/2012 | Colgrove et al. |
| 2012/0079351 A1 | 3/2012 | Cideciyan et al. |
| 2012/0084506 A1 | 4/2012 | Colgrove et al. |
| 2012/0084507 A1 | 4/2012 | Colgrove et al. |
| 2012/0198128 A1* | 8/2012 | Van Aken ........... G06F 12/0246 711/103 |
| 2012/0260020 A1 | 10/2012 | Suryabudi et al. |
| 2012/0272000 A1 | 10/2012 | Shalvi |
| 2012/0278531 A1 | 11/2012 | Horn |
| 2012/0284460 A1 | 11/2012 | Guda |
| 2012/0324191 A1 | 12/2012 | Strange et al. |
| 2013/0019051 A1* | 1/2013 | Somanache ......... G06F 12/0246 711/103 |
| 2013/0031301 A1* | 1/2013 | Barndt ................ G06F 12/0246 711/103 |
| 2013/0054980 A1 | 2/2013 | Frost et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

FOREIGN PATENT DOCUMENTS

| | | |
|---|---|---|
| JP | 2004-326867 A | 11/2004 |
| JP | 2008102819 A | 5/2008 |
| KR | 1020100076447 | 8/2011 |
| KR | 100929371 | 11/2011 |
| WO | WO 2012058328 A1 | 5/2012 |
| WO | WO 2014065967 A1 | 5/2014 |
| WO | 2014088747 | 6/2014 |
| WO | WO 2014088960 A1 | 6/2014 |
| WO | WO 2014088684 A1 | 6/2014 |

OTHER PUBLICATIONS

Interview Summary dated Oct. 24, 2014 from U.S. Appl. No. 13/659,099, 1 page.

Guangming Lu, et al. U.S. Appl. No. 13/718,289, filed Dec. 18, 2012, 27 pages.

Guangming Lu, et al. U.S. Appl. No. 13/742,243, filed Jan. 15, 2013. (This application Claims Priority from U.S. Appl. No. 61/738,764, filed Dec. 18, 2012). 22 pages.

Guangming Lu, et al. U.S. Appl. No. 13/742,248, filed Jan. 15, 2013. (This application Claims Priority from U.S. Appl. No. 61/738,732, filed Dec. 18, 2012). 32 pages.

International Search Report and Written Opinion dated Jan. 20, 2014 from PCT/US2013/061249, filed Sep. 23, 2013, Applicant: Western Digital Technologies, Inc., 11 pages.

Shayan S. Garani, et al., U.S. Appl. No. 13/725,965, filed Dec. 21, 2012, 31 pages.

Shayan S. Garani, U.S. Appl. No. 13/417,057, filed Mar. 9, 2012, 30 pages.

Ming, et al., "An improved variable length coding scheme using structured LDPC codes," International Conference on Wireless Communication and Signal Processing (WCSP). IEEE, Oct. 2010, 5 pages.

Jonghong, et al., "A high-speed layered min-sum LDPC decoder for error correction of NAND flash memories," 2011 IEEE 54th International Midwest Symposium on Circuits and Systems (MWSCAS), Aug. 2011, 4 pages.

Japanese Decision to Grant a Patent from Japanese Application No. 2015-539605, dated Mar. 14, 2017.

Chinese Office Action from Chinese Application No. 201380067610.7, dated Mar. 14, 2017.

* cited by examiner

| Column Weight | P Matrix Size (bits) | Code Length = 2048 + 128·Δ (bytes) | | |
|---|---|---|---|---|
| | | | Δ = 1 | Δ = 2 |
| 4 | 256 | C1 Row Weight | 68 | 72 |
| | | Code Length (bytes) | 2176 | 2304 |
| | | User Data (bytes) | 2048 | 2176 |
| | | Code Rate | 0.941 | 0.944 |
| | 512 | C3 Row Weight | 34 | 36 |
| | | Code Length (bytes) | 2176 | 2304 |
| | | User Data (bytes) | 1920 | 2048 |
| | | Code Rate | 0.882 | 0.889 |
| 5 | 256 | C2 Row Weight | 68 | 72 |
| | | Code Length (bytes) | 2176 | 2304 |
| | | User Data (bytes) | 2016 | 2144 |
| | | Code Rate | 0.926 | 0.931 |
| | 512 | C4 Row Weight | 34 | 36 |
| | | Code Length (bytes) | 2176 | 2304 |
| | | User Data (bytes) | 1856 | 1984 |
| | | Code Rate | 0.853 | 0.861 |

ADAPTIVE ERROR CORRECTION CODES FOR DATA STORAGE SYSTEMS

RELATED APPLICATION

This application is a continuation of U.S. patent application Ser. No. 13/659,099, filed on Oct. 24, 2012, titled "ADAPTIVE ERROR CORRECTION CODES FOR DATA STORAGE SYSTEMS," the disclosure of which is hereby incorporated by reference in its entirety.

BACKGROUND

Technical Field

This disclosure relates to data storage systems, such as solid state drives, for computer systems. More particularly, the disclosure relates to adaptive error correction codes for data storage systems.

Description of the Related Art

Non-volatile memory arrays often have limited endurance. The endurance of the memory array is typically contingent on usage pattern and wear. In addition, endurances depend on a particular type of the non-volatile memory array. For example, memory arrays with multi-level cell (MLC) NAND media typically have a lower endurance than memory arrays with single-level cell (SLC) NAND media. To protect user data stored to memory arrays from corruption, which may be caused by a diminished endurance, parity data can be determined and stored along with user data to facilitate error detection and/or correction.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

Figure 1:
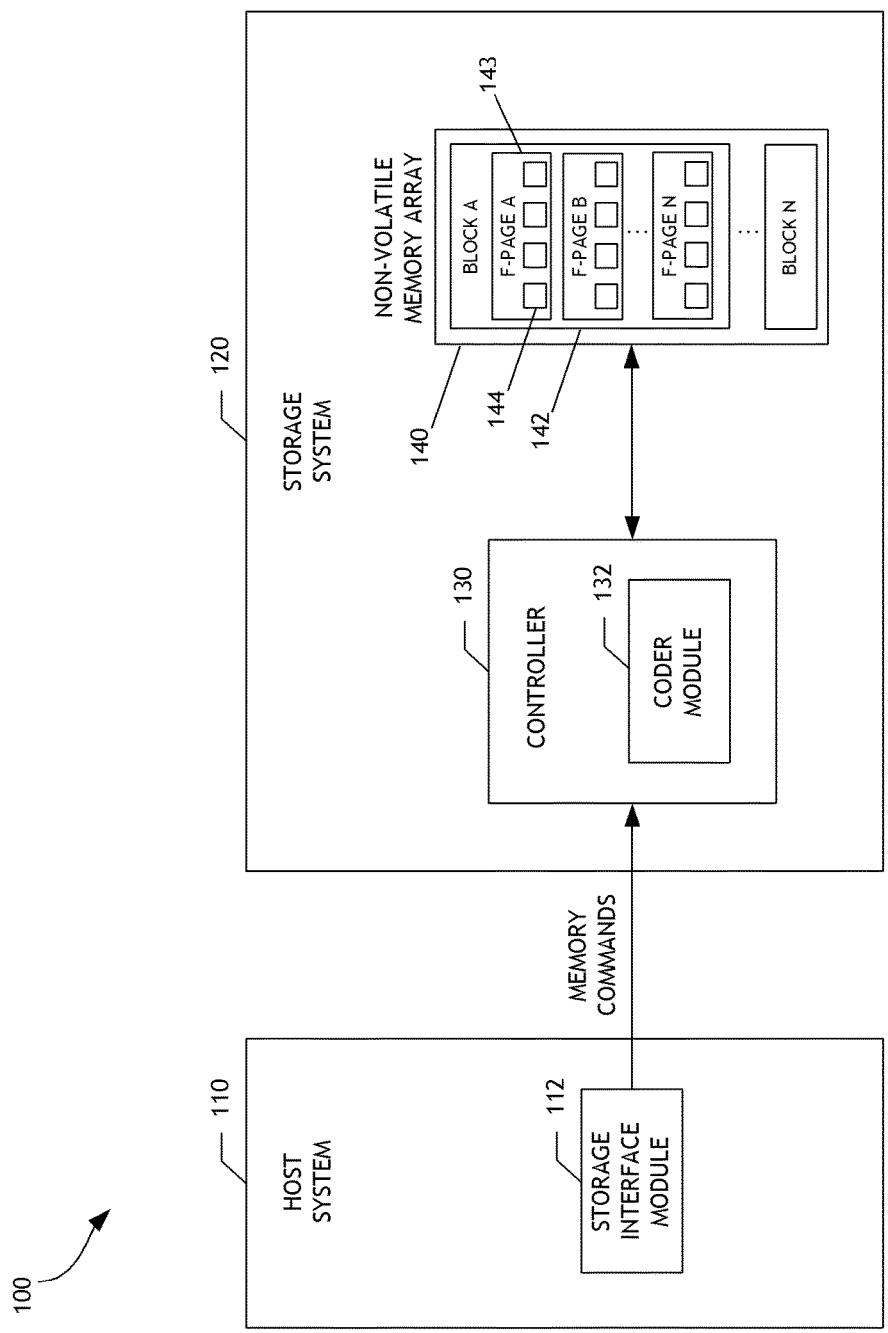
FIG. 1 illustrates a storage system that adaptively codes data according to one embodiment of the invention.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

In some embodiments, "coding" or "to code" data as used in this disclosure refer to the process of encoding data and/or the process of decoding data.

Overview

Storage systems such as solid state drives typically include one or more controllers coupled with non-volatile memory arrays. It is commonplace for such controllers to be designed/manufactured by one party and the non-volatile memory arrays to be designed/manufactured by another party. In addition, memory arrays from different manufacturers tend to have different internal formatting, including different memory page formats, where each memory page format corresponds to one of multiple memory pages sizes. Also, for costs and various other competitive reasons, storage system manufacturers typically use memory arrays from different manufacturers. For example, a storage system manufacturer may use one brand of memory array in a current production cycle and another brand in the next production cycle. Also, different memory arrays may be used for different storage system models priced at different levels.

Therefore, one common design approach is to have storage systems include one or more controllers with multiple specialized hardware, firmware, and/or software that encode/decode data read from or written to the memory arrays from different manufacturers, with a subset of such hardware, firmware, and/or software actually used depending on the actual memory arrays paired with the controller(s) at time of assembly or at the final design stage. As a result, storage systems can include multiple controllers or extra, unused hardware, firmware, and/or software to support multiple memory page formats for the one or more memory arrays that are not included in the finally assembled storage systems.

In the alternative, to reduce the amount of hardware, firmware, and/or software included in storage systems, storage systems and controllers can be constructed to support only one specific, known memory page format having a known memory page size and may not to support other memory page formats. Such an approach, however, limits the usefulness of storage systems and controllers to other types of memory arrays, and multiple different storage systems and controllers may need to be constructed to support multiple memory array types. In addition, in some instances, a memory page format of a memory array may not be known when storage systems and controllers are designed/constructed. Accordingly, improved systems and methods for adaptively coding data for multiple known or unknown memory storage formats are desired.

In some embodiments of the present invention, a storage system includes a controller and a non-volatile memory array having a plurality of memory pages with a common memory page size. The controller determines the common memory page size for the non-volatile memory array and selects a code word length, such as a low-density parity-check (LDPC) code word length, from multiple pre-defined code word lengths based on the common memory page size. By selectively using an appropriate code word length (chosen from multiple pre-defined code word lengths) and corresponding coding parameters, the controller uses at least some common hardware, firmware, and/or software to support multiple known or unknown memory page formats. Thus, the controller can selectively adapt its operations, so it can be paired with memory arrays of different formats made by different manufacturers.

In some embodiments, a controller of a storage system adjusts coding parameters for coding user data as memory pages, blocks, or dies of the non-volatile memory array age and/or wear out due, in part, to use of the memory array. The mechanism of adjusting coding parameters enables the controller to support additional parity per unit data over time, thereby improving the error correction or detection capabilities as the quality (e.g., data retention capabilities) of the memory array diminishes. Moreover, the mechanism of adjusting coding parameters facilitates a balancing of decoding time due to additional parity per unit data with error correction or detection benefits of additional parity data. In addition, the controller can store adjusted coding parameters for memory pages, blocks, or dies of the memory array to permit different code or parity rates for different memory pages, blocks, or dies.

System Overview

FIG. 1 illustrates a storage system 120 that adaptively codes data according to one embodiment of the invention. As is shown, a storage system 120 (e.g., hybrid hard drive, solid state drive, etc.) includes a controller 130 and a non-volatile memory array 140, which comprises one or more blocks of storage, identified as Block "A" 142 through Block "N". Each block comprises a plurality of flash pages (F-pages). For example, Block A 142 of FIG. 1 includes a plurality of F-pages, identified as F-pages A 153, B, through N. In some embodiments, each "F-page" is a smallest grouping of memory cells in the non-volatile memory array 140 that can be programmed in a single operation or as a unit. Further, each F-page includes a plurality of error correcting code pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages.

The controller 130 can receive data and/or storage access commands from a storage interface module 112 (e.g., a device driver) in a host system 110. Storage access commands communicated by the storage interface 112 can include write and read commands issued by the host system 110. The commands can specify a logical block address in the storage system 120, and the controller 130 can execute the received commands in the non-volatile memory array 140. In a hybrid hard drive, data may be stored in magnetic media storage component (not shown in FIG. 1) in addition to the non-volatile memory array 140.

The storage system 120 can store data received from the host system 110 so that the storage system 120 can act as memory storage for the host system 110. To facilitate this function, the controller 130 can implement a logical interface. The logical interface can present to the host system 110 storage system memory as a set of logical addresses (e.g., contiguous address) where data can be stored. Internally, the controller 130 can map logical addresses to various physical memory addresses in the non-volatile memory array 140 and/or other memory module(s).

The controller 130 includes a coder module 132. In one embodiment, the coder module 132 determines coding parameters for decoding/encoding data (e.g., user data) read from or written to memory pages, such as E-pages, of the non-volatile memory array 140. The coding parameters can be used for decoding user data read from the non-volatile memory array 140, encoding user data for storage to the non-volatile memory array 140, and other uses such as error detection or correction. The coding parameters can include LDPC coding parameters, such as the column weight of a G or H coding matrix, the row weight of a G or H coding matrix, a P matrix size (e.g., where the P matrix is a sub-matrix of a G or H coding matrix), and the like. Further, the coder module 132 can determine parity data for unpadded or padded user data, as well as decode user data having corresponding parity data and padding. In addition, the coder module 132 can adjust a code or parity rate for coding data by adjusting the coding parameters. The controller 130 and/or coder module 132 can further include internal memory (not shown), which may be of one or more suitable memory types.

The non-volatile memory array 140 can be implemented using NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile memory) chips, or any combination thereof. In one embodiment, the non-volatile memory array 140 preferably includes multi-level cell (MLC) devices having multi-level cells capable of storing more than a single bit of information, although single-level cell (SLC) memory devices or a combination of SLC and MLC devices may be used. In one embodiment, the storage system 120 can include other memory modules, such as one or more magnetic memory modules. The storage system 120 can further include other types of storage media, such as magnetic storage.

Adaptive Data Coding

Figure 2:
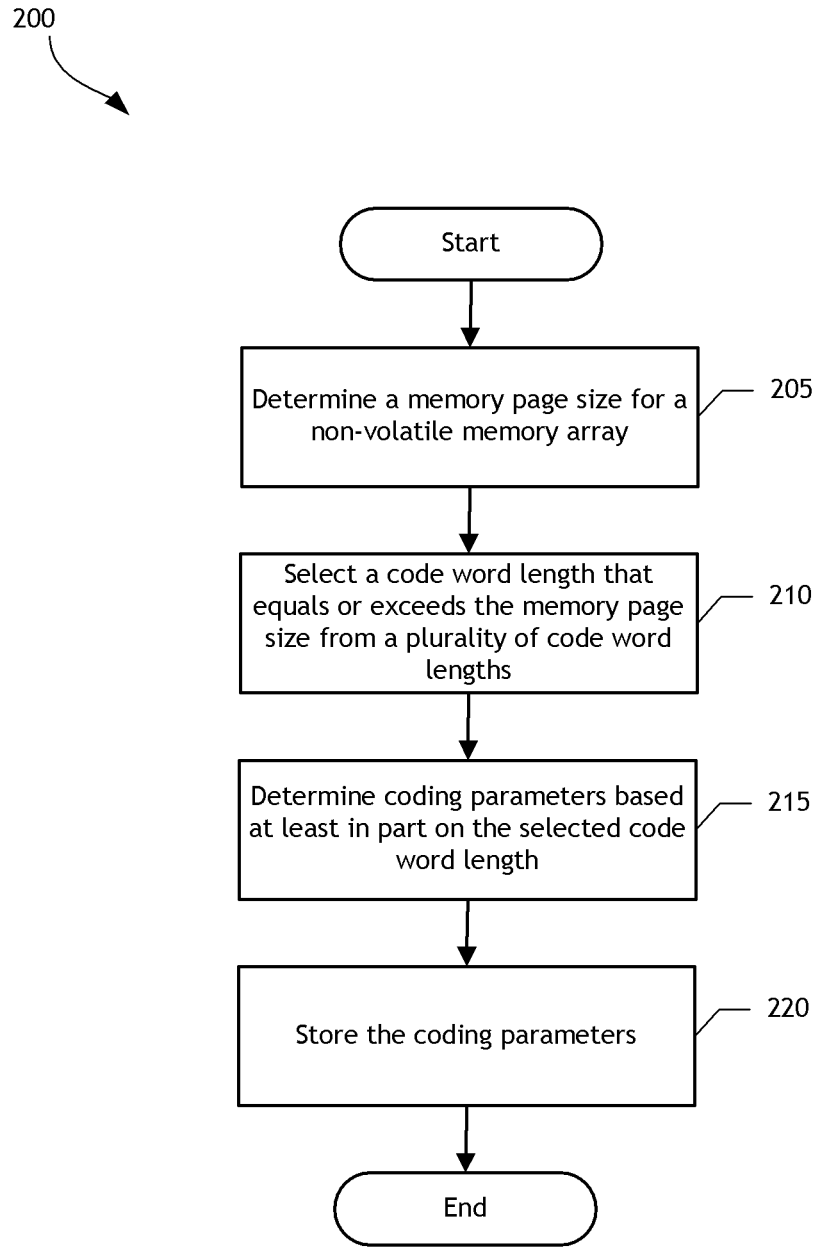
FIG. 2 is a flow diagram illustrating a process of determining coding parameters for coding data according to one embodiment of the invention.

FIG. 2 is a flow diagram illustrating a process 200 of determining coding parameters for coding data according to one embodiment of the invention. The process 200 can be executed by the controller 130 and/or the coder module 132. Advantageously, the process 200 can enable the controller 130 and/or the coder module 132 to support multiple non-volatile memory page formats using a plurality of code word lengths.

At block 205, the process 200 determines a memory page size for a non-volatile memory array, such as the non-volatile memory array 140. The memory page size can be, for instance, provided by the memory array vendor or calculated based on another known memory size. For example, the memory page size can correspond to an E-page size of the non-volatile memory array, and the process 200 can calculate the E-page size by looking-up a vendor provided F-page size of the memory array and dividing the F-page size by an appropriate constant for the non-volatile memory array, such as 4 or 8. In other embodiments, the memory page size can correspond to an F-page size.

At block 210, the process 200 selects a code word length that equals or exceeds the memory page size from a plurality of code word lengths. For example, the memory page size can be 2164 bytes or octets, and the plurality of pre-defined code word lengths can include lengths of 2176 bytes and 2304 bytes. In one embodiment, the process 200 selects the LDPC code word length having a minimum size or number of bytes of data equal to or greater than the memory page size from a plurality of pre-defined LDPC code word lengths. For example, the process 200 can select the code word length of 2176 bytes, which exceeds 2164 byte memory page size and has a minimum size of the plurality of pre-defined LDPC code word lengths.

At block 215, the process 200 determines coding parameters based at least in part on the selected code word length. The coding parameters can be used when coding data read from or written to the non-volatile memory array and enable the process 200 to manage a code rate (e.g., an amount of user data per total data of a data unit, where total data includes user data and parity data) for data. In one embodiment, the coding parameters for a LDPC code word length include a column weight, a P matrix size, and a row weight, and further include at least one of a code rate, an amount of user data, and an amount of parity data.

At block 220, the process 200 stores the coding parameters. For example, the process 200 can store the coding parameters in the non-volatile memory array 140 and/or in one or more other storage media of the storage system 120. The process 200 can store the coding parameters in internal memory of the controller 130 and/or the coder module 132. The stored coding parameters can facilitate using different coding parameters for coding different pages, blocks, or other divisions and/or subdivisions of the non-volatile memory array 140 and for tracking and adjusting coding parameters over time as portions of the non-volatile memory array age and/or wear out.

Figure 3:
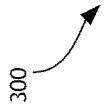
FIG. 3 is a table illustrating relationships between low-density parity-check (LDPC) coding parameters and LDPC code word lengths according to one embodiment of the invention.

FIG. 3 is a table 300 illustrating relationships between LDPC coding parameters and LDPC code word lengths according to one embodiment of the invention. The table 300 can designate the LDPC code word lengths and LDPC coding parameters supported by a controller, such as the controller 130 and/or coder module 132. The table 300 can be stored in the non-volatile memory array 140, one or more other storage media of the storage system 120, and/or in the internal memory of the controller 130 and/or the coder module 132. The table 300 includes two code length columns indicating two supported LDPC code word lengths. One LDPC code word length equals 2176 bytes (2048+128·1 bytes), and the other LDPC code word length equals 2304 bytes (2048+128·2 bytes). It has been discovered that various code rates around 2 kbytes can provide an optimal trade-off between complexity and performance.

For each code length, the LDPC coding parameters of column weight, P matrix size, and row weight can be varied to enable coding of data using different designed code rates (e.g., different amounts of user data per total data of a data unit, where total data includes user data and parity data) as listed in table 300. For example, if the LDPC code word length equals 2176 bytes, the applied LDPC coding parameters can be one of the LDPC coding parameter sets at circles C1, C2, C3, or C4. In one instance, the LDPC coding parameters can be chosen at circle C3, which correspond to a column weight of 4, P matrix size of 512, and row weight of 34 and further to a code rate of 0.882 (1920 bytes of user data for 2176 byes of total code length). Further, in one embodiment, the code length, which may be defined as 2048+128×Δ, can be adjusted based on selecting Δ as 1, 2, etc. As is illustrated, selecting the value of Δ also affects the code rate. For example, at circle C1, selecting Δ to be 1 results in the code rate of 0.941, and if the column weight, P matrix size, and row weight remain unchanged, selecting Δ to be 2 results in the code rate of 0.944. As will be further explained, the various pre-defined code rates can be used to accommodate memory arrays of different page sizes. For example, as shown, the two code lengths of 2176 and 2304 bytes can accommodate page sizes of 2176 and 2304 bytes. It is to be noted that in practice the number of pre-defined code lengths can be much higher than two to accommodate various page sizes.

A controller supporting the LDPC coding parameters of table 300 can advantageously select one code length for a non-volatile memory array and adjust the LDPC coding parameters to code data at different code rates. For instance, when a memory array with an E-page size of 2176 bytes is relatively new (e.g., lightly used) and/or experiences or exhibits few coding errors, the LDPC coding parameters at circle C1 can be selected for coding data. The LDPC coding parameters at circle C1 correspond to a column weight of 4, P matrix size of 256, and row weight of 68 and further to a code rate of 0.941. A total of 128 bytes of parity can be used for coding 2048 bytes of data at circle C1. As memory pages, blocks, or dies of the memory array age and/or wear out, the LDPC coding parameters at circles C2, C3, and C4 can instead be selected for coding data. The controller can, accordingly, gradually increase the amount of parity per unit data from a code rate of 0.941 to codes rates of 0.926, 0.882, and 0.853 at circles C2, C3, and C4, respectively, in response to changes in the quality (e.g., loss of quality) of the non-volatile memory array.

Adaptive Code Shortening

Figure 4A:
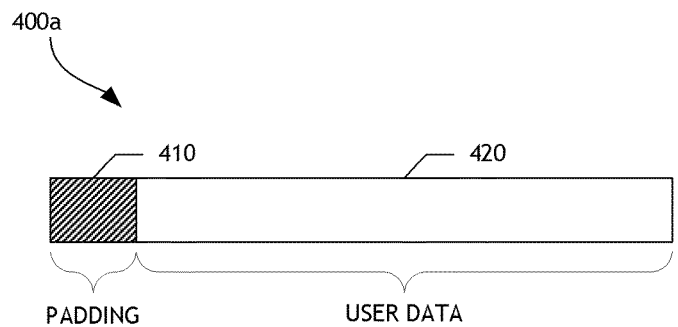
FIGS. 4A-4C are diagrams illustrating padded user data and parity data according to one embodiment of the invention.
Figure 4B:
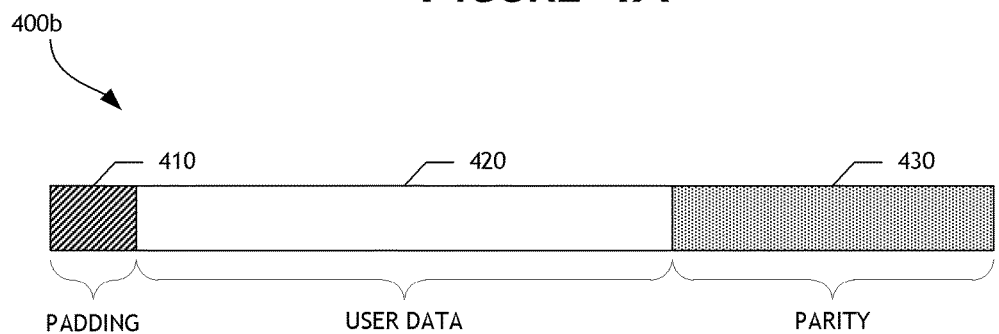
Figure 4C:
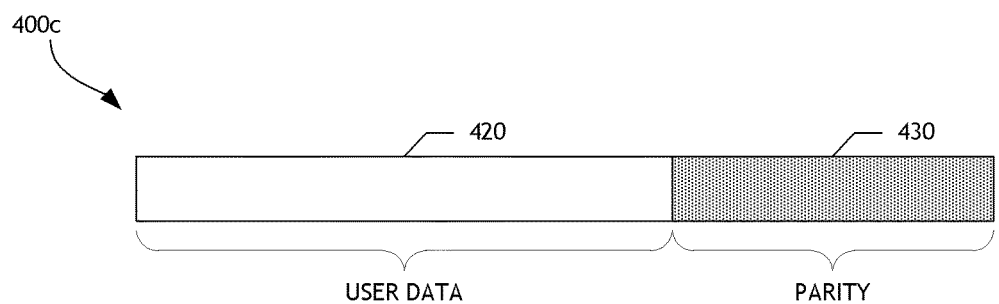

Through adaptive code shortening, some embodiments of the invention can accommodate memory arrays with page sizes that do not match up exactly with the pre-defined code lengths. FIGS. 4A-4C are diagrams illustrating padded user data and parity data used in adaptive code shortening according to one embodiment of the invention. In particular, FIGS. 4A-4C illustrate how shortening may be used to adapt code word lengths to match the memory page size for a non-volatile memory array. Advantageously, shortening enables the controller 130 and/or coder module 132 to support a memory page format in which the memory page size does not equal any code word length of a plurality of pre-defined code word lengths. For instance, if the controller 130 and/or coder module 132 support pre-defined LDPC code word lengths equal to 2176 and 2304 bytes, shortening can be used so that the controller 130 and/or coder module 132 further support a memory page size of 2164 bytes. Moreover, shortening can permit the controller 130 and/or coder module 132 to adaptively code data to match the non-volatile memory array format without sacrificing a large bit error rate performance.

In one embodiment, shortening comprises three operations. First, padding data is added to the user data to be encoded. The padding data in one embodiment is sized to be the difference between the pre-defined code length and memory page size. Second, parity data is generated based on the padding and user data. Third, the user data and parity data, which add up to the memory page size, are stored in the memory page. The padding data is not stored, but will be appended to the user data upon decoding (e.g., when the user data and parity data is read out from the memory page at a later time).

FIG. 4A illustrates padding 410 and user data 420 of a data unit 400a. The user data 420 corresponds to an amount of user data for data unit 400a, and the padding 410 corresponds to a padding that facilitates code shortening. The padding 410 can include a data set of entirely zeros, entirely ones, etc., or any known or pre-defined data pattern. Continuing the example of the previous paragraph, if the memory page size is 2164 bytes for the non-volatile memory array, the controller 130 and/or coder module 132 can select, from various pre-defined code lengths such as those shown in table 300, the shortest LDPC code word length having a size equal to or greater than 2164 bytes. In this case, the code length of 2176 bytes is selected. The controller 130 and/or coder module 132 can determine that the padding 410 should include a data set having length that is equal to the difference between the code word length (2176) and the memory page size (2164) of the non-volatile memory array, or 2176−2164=12 bytes of padding data. Depending on the LDPC coding parameters for the data unit 400a, the controller 130 and/or coder module 132 can further determine an amount of bytes reserved for user data 420 and an appropriate G coding matrix for determining and/or generating parity data.

FIG. 4B illustrates an example encoding process according to one embodiment. In effect, the user data 420 is "padded" so that the combined user data and padding meet the amount of bytes reserved for user data in the chosen pre-defined code length. The parity 430 is then generated for the combined padding 410 and user data 420 of a data unit 400b. Continuing the example of the previous paragraph, the appropriate G coding matrix can be used to determine LDPC parity data for parity 430. Note that as described above, the actual distribution of the 2176 bytes between padding 410, user data 420, and parity data 430 may vary. The following table illustrates some of the possible configurations (all sizes in bytes):

Memory Page Size 2164 Bytes

| Configuration C1 (FIG. 3) | | Code Length-2176 Reserved for User Data | Reserved for Parity |
|---|---|---|---|
| | | 2048 | 128 |
| With Shortening Scheme | Padding (FIG. 4-410) | Actual User Data (FIG. 4-420) | Parity (FIG. 4-430) |
| | 12 | 2036 | 128 |
| Memory Page Size | Not written to memory | 2164 (2036 + 128) | |

Memory Page Size 2164 Bytes

| Configuration C3 (FIG. 3) | | Code Length-2176 Reserved for User Data | Reserved for Parity |
|---|---|---|---|
| | | 1920 | 256 |
| With Shortening Scheme | Padding (FIG. 4-410) | Actual User Data (FIG. 4-420) | Parity (FIG. 4-430) |
| | 12 | 1908 | 256 |
| Memory Page Size | Not written to memory | 2164 (1908 + 256) | |

FIG. 4C illustrates a data unit 400c, having user data 420 and parity 430 of the data unit 400b with padding 410 removed. The user data 420 and the parity 430 can be written to and subsequently read from a memory page of the non-volatile memory array 140. As shown in the tables above, the amount of user data 420 and parity data 430 can equal the memory page size of the non-volatile memory array, and the padding data is not written to the page. When the page is read out later, as part of the decoding, the padding is appended back to the user data read from the page. In this manner, coding for arbitrary page sizes can be performed using one of the plurality of pre-defined code word lengths at the cost of a small loss in coding efficiency.

Figure 5:
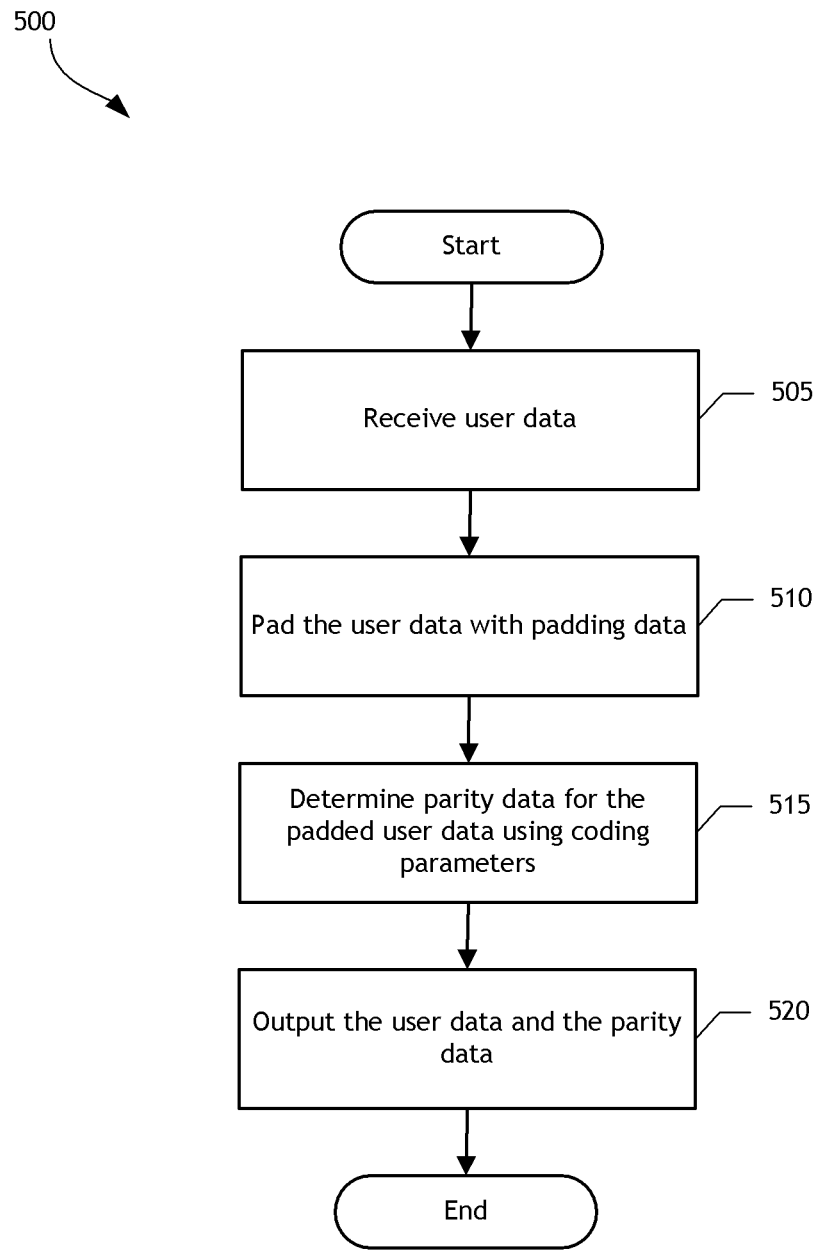
FIG. 5 is a flow diagram illustrating a process of adaptive code shortening according to one embodiment of the invention.

FIG. 5 is a flow diagram illustrating a process 500 of adaptive code shortening according to one embodiment of the invention. The process 500 can be executed by the controller 130 and/or the coder module 132. Advantageously, the process 500 can enable the controller 130 and/or the coder module 132 to support memory page sizes that do not equal any code word length of a plurality of pre-defined code word lengths supported by the controller 130 and/or the coder module 132. The process 500 can be used to construct and manage data units 400a, 400b, and 400c described in FIGS. 4A-4C.

At block 505, the process 500 receives user data. The user data can be received from the storage interface module 112 along with a write command to write the user data to a non-volatile memory array, such as the non-volatile memory array 140.

At block 510, the process 500 pads the user data with padding data. The padding data can include a data set of entirely zeros, entirely ones, or a known or pre-defined data pattern. In addition, at block 510, the process 500 can further divide the user data into units having a size equal to an amount of user per data unit, which depends on corresponding coding parameters. For example, if the non-volatile memory array has a memory page size equal to 2164 bytes and the LDPC coding parameters correspond to the parameters at circle C3 of FIG. 3, the user data can be divided into units having a size equal to 1908 bytes.

At block 515, the process 500 determines parity data for the padded user data using coding parameters. Continuing the example of the previous paragraph, if the LDPC coding parameters correspond to the parameters at circle C3, an appropriate G coding matrix can be selected and used to determine LDPC parity data for the padded user data.

At block 520, the process 500 outputs the user data and parity data. For example, the process 500 can output the user data and parity data for storage to E-page 144 of F-page 143 of the non-volatile memory array 140. It can be noted that the padding described with to respect to blocks 510 and 515 can be characterized as "virtual padding" since the padding itself may not be written to the memory page.

Code Rate Adjusting

Figure 6:
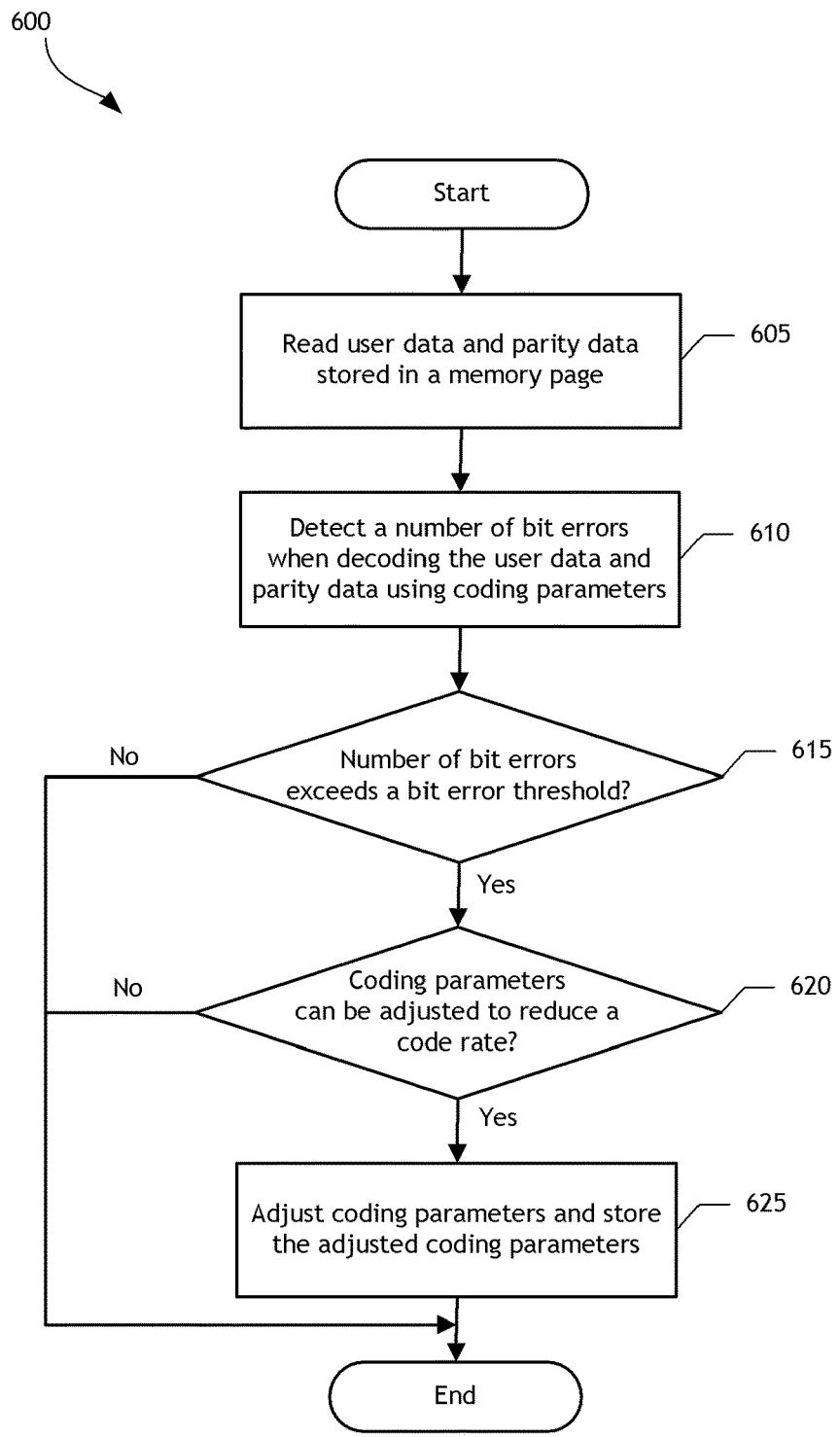
FIG. 6 is a flow diagram illustrating a process of adjusting a code rate according to one embodiment of the invention.

FIG. 6 is a flow diagram illustrating a process 600 of adjusting a code rate according to one embodiment of the invention. The process 600 can be executed by the controller 130 and/or the coder module 132. Advantageously, the process 600 can enable the controller 130 and/or the coder module 132 to adjust the code rate (e.g., an amount of parity per unit data) of memory pages, blocks, or other divisions of a non-volatile memory array as the memory pages, blocks, or other divisions wear out and/or experience decreased quality.

At block 605, the process 600 reads user data and parity data stored in a memory page. For example, the process 600 can perform a read of F-page 143 in response to a read command from the host system 110.

At block 610, the process 600 detects a number of bit errors when decoding the user data using parity data and coding parameters. For instance, the process 600 can determine a number of detected bit errors when decoding the user data using stored parity data and LDPC coding parameters corresponding to the memory page.

At block 615, the process 600 determines whether the number of bit errors exceeds a bit error threshold. The bit error threshold can depend or vary based on the coding parameters for coding data to the memory page. For example, the bit error threshold for the LDPC coding parameters at circle C1 of FIG. 3 may be lower than the bit error threshold for the LDPC coding parameters at circle C2. If the process 600 determines that the number of bit errors does not exceed the bit error threshold, the process 600 terminates. On the other hand, if the process 600 determines that the number of bit errors exceeds the bit error threshold, the process 600 moves to block 620.

At block 620, the process 600 checks whether the coding parameters can be adjusted to reduce a code rate. In other words, the process 600 can determine whether more parity data can be used for coding. In one embodiment, the process 600 can determine whether the LDPC coding parameters may be adjusted while keeping a LDPC code word length unchanged. For instance, if E-page 144 is currently coded using the LDPC coding parameters at circle C3 of FIG. 3, the LDPC coding parameters can be adjusted to the parameters at circle C4. Alternatively, if E-page 144 currently is coded using LDPC coding parameters at circle C4 and the table 300 contains the only available LDPC coding parameters, the parameters may not be further adjusted to a lower code rate. If the process 600 determines that the coding parameters may not be adjusted to reduce the code rate, the process 600 terminates. On the other hand, if the process 600 determines that the coding parameters can be adjusted to reduce a code rate, the process 600 moves to block 625. In one embodiment, the change of code rate may be managed at a block level where the pages in the block are switched to a new code rate at the same time. In one embodiment, where MLC memory is used, upon a determination that a further reduced code rate cannot be used, rather than terminating the process 600, the page (or block of pages) may be configured to operate in a lower-page only mode.

At block 625, the process 600 adjusts the coding parameters and stores the adjusted coding parameters to reduce a code rate for a next write operation. The process 600 can store the adjusted coding parameters in the non-volatile memory array 140, other memory module of the storage system 120, and/or internal memory of the controller 130 and/or coder module 132. The process 600 can store an indication of the code rate or LDPC coding parameters for coding data to facilitate management of LDPC coding parameters on a memory page, block, or other level division of a non-volatile memory array. Further, the adjusted coding parameters can be used for coding user data associated with a subsequent write command received from the host system 110.

Other Variations

Those skilled in the art will appreciate that in some embodiments, other approaches and methods can be used. For example, the coding techniques disclosed herein can apply to codes besides LDPC codes, such as other iterative codes like turbo codes. In addition, although the coding parameters and other values disclosed in the table 300 of FIG. 3 illustrate an example set of relationships between coding parameters and code word lengths, other or additional coding relationships can be used. The table 300 can include column weights with values less than 4 and greater than 5 (such as 3 or 6), P matrix sizes with values less than 256 bits or greater than 512 (such as 128 or 1024), Δ values of less than 1 or greater than 2 (such as −1, 0, 3, or 4), Δ values having a corresponding granularity other than 128 bytes (such as 64 bytes), and a base code length with a value of less or greater than 2048 (such as 2176). Further, an amount of parity data in each data unit can be set to different values or varied depending on a quality of a storage medium. Additionally, quality metrics other than or in addition to bit errors can be used to determine whether to adjust coding parameters for coding data. Moreover, depending on the embodiment, certain of the steps described above may be removed, and others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
   a non-volatile memory array comprising a plurality of memory pages; and
   a controller configured to:
   access coding parameters used to encode user data and parity data to be stored in the plurality of memory pages;
   encode, using the coding parameters, first user data and first parity data as a first data unit;
   store the first data unit in the plurality of memory pages;
   decode, using the coding parameters, the first data unit retrieved from the plurality of memory pages;
   detect a first number of bit errors encountered during decoding the first data unit retrieved from the plurality of memory pages;
   in response to determining that the first number of bit errors exceeds a first threshold, adjust the coding parameters to increase an amount of parity data per total data that is included in data units subsequently encoded and stored in the plurality of memory pages; and
   encode, using the adjusted coding parameters, second user data and second parity data as a second data unit to be stored in the plurality of memory pages.

2. The data storage system of claim 1, wherein the controller is further configured to:
   store the second data unit in the plurality of memory pages;
   decode, using the adjusted coding parameters, the second data unit retrieved from the plurality of memory pages;
   detect a second number of bit errors encountered during decoding the second data unit retrieved from the plurality of memory pages;
   in response to determining that the second number of bit errors exceeds a second threshold greater than the first threshold, modify the adjusted coding parameters to increase the amount of parity per total data that is included in the data units subsequently encoded and stored in the plurality of memory pages; and encode, using the modified coding parameters, third user data and third parity data as a third data unit to be stored in the plurality of memory pages.

3. The data storage system of claim 1, wherein the coding parameters comprise low-density parity-check (LDPC) coding parameters including a P matrix size and a column weight, and the controller is configured to adjust the coding parameters by changing at least one of the P matrix size and the column weight.

4. The data storage system of claim 1, wherein the controller is configured to access alternative coding parameters used to encode the user data and the parity data to be stored in a portion of the non-volatile memory array other than the plurality of memory pages, the alternative coding parameters being different from the coding parameters.

5. The data storage system of claim 1, wherein the controller is configured to adjust the coding parameters in response to determining that the first number of bit errors exceeds the first threshold and that a limit on the amount of parity per total data that is included in the data units has not been reached.

6. In a data storage system comprising a controller, a method of coding data, the method comprising:
  accessing coding parameters used to encode user data and parity data to be stored in a plurality of memory pages of a non-volatile memory array;
  encoding, using the coding parameters, first user data and first parity data as a first data unit;
  storing the first data unit in the plurality of memory pages;
  decoding, using the coding parameters, the first data unit retrieved from the plurality of memory pages;
  detecting a first number of bit errors encountered during decoding the first data unit retrieved from the plurality of memory pages;
  in response to determining that the first number of bit errors exceeds a first threshold, adjusting the coding parameters to increase an amount of parity data per total data that is included in data units subsequently encoded and stored in the plurality of memory pages; and
  encoding, using the adjusted coding parameters, second user data and second parity data as a second data unit to be stored in the plurality of memory pages.

7. The method of claim 6, further comprising:
  storing the second data unit in the plurality of memory pages;
  decoding, using the adjusted coding parameters, the second data unit retrieved from the plurality of memory pages;
  detecting a second number of bit errors encountered during decoding the second data unit retrieved from the plurality of memory pages;
  in response to determining that the second number of bit errors exceeds a second threshold greater than the first threshold, modifying the adjusted coding parameters to increase the amount of parity per total data that is included in the data units subsequently encoded and stored in the plurality of memory pages; and
  encoding, using the modified coding parameters, third user data and third parity data as a third data unit to be stored in the plurality of memory pages.

8. The method of claim 6, wherein the coding parameters comprise low-density parity-check (LDPC) coding parameters including a P matrix size and a column weight, and wherein said adjusting the coding parameters comprises changing at least one of the P matrix size and the column weight.

* * * * *